United States Patent
Kim et al.

(10) Patent No.: US 11,585,867 B2
(45) Date of Patent: Feb. 21, 2023

(54) MULTI GROUND LINE DISCONNECTION INSPECTION DEVICE AND METHOD AND ELECTRONIC CONTROL DEVICE INCLUDING THE SAME

(71) Applicant: MANDO CORPORATION, Pyeongtaek-si (KR)

(72) Inventors: Se Hyun Kim, Gyeonggi-do (KR); Yutae Kim, Seongnam-si (KR)

(73) Assignee: HL MANDO CORPORATION, Pyeongtaek-si (KR)

( * ) Notice: Subject to any disclaimer, the term of this patent is extended or adjusted under 35 U.S.C. 154(b) by 38 days.

(21) Appl. No.: 17/173,774

(22) Filed: Feb. 11, 2021

(65) Prior Publication Data
US 2021/0255253 A1    Aug. 19, 2021

(30) Foreign Application Priority Data

Feb. 13, 2020   (KR) ........................ 10-2020-0017734

(51) Int. Cl.
*G01R 31/67* (2020.01)
*G01R 31/58* (2020.01)
*G01R 21/06* (2006.01)

(52) U.S. Cl.
CPC ............. *G01R 31/67* (2020.01); *G01R 21/06* (2013.01); *G01R 31/58* (2020.01)

(58) Field of Classification Search
CPC ........ G01R 31/67; G01R 21/06; G01R 31/58; G01R 31/54; G01R 1/206; G01R 19/0084; G01R 31/52
USPC ....................................................... 324/538
See application file for complete search history.

(56) References Cited

U.S. PATENT DOCUMENTS

| | | | | |
|---|---|---|---|---|
| 5,508,872 A | * | 4/1996 | Khoo | H02H 5/105 361/49 |
| 2009/0287430 A1 | * | 11/2009 | Atoji | G01R 31/52 702/58 |
| 2013/0120690 A1 | * | 5/2013 | Tsujii | G01R 31/67 315/192 |
| 2014/0092500 A1 | * | 4/2014 | Givelin | H02H 1/0007 361/18 |
| 2015/0285851 A1 | * | 10/2015 | Kawamura | G01R 31/14 324/509 |
| 2016/0245854 A1 | * | 8/2016 | Vangool | G01R 27/18 |

(Continued)

FOREIGN PATENT DOCUMENTS

| | | | | |
|---|---|---|---|---|
| CN | 102830283 A | * | 12/2012 | ............. G01R 31/40 |
| EP | 1986935 B1 | * | 11/2009 | ........... G01R 31/026 |

*Primary Examiner* — Tung X Nguyen
*Assistant Examiner* — Robert P Alejnikov, Jr.
(74) *Attorney, Agent, or Firm* — Hauptman Ham, LLP (57) ABSTRACT

The present invention provides a multi ground line disconnection inspection device as a device for inspecting whether a plurality of ground lines that are connected to a ground node of an electronic control device are disconnected, including a plurality of test lines having one end connected to a plurality of ground lines, respectively, a plurality of connection switches connected to the ground node and the other end of a plurality of test lines, respectively, a plurality of test power supplies for applying test voltages to a plurality of test nodes respectively positioned on a plurality of test lines, respectively, and a determination unit for determining whether a plurality of ground lines are disconnected by detecting voltages of a plurality of test nodes.

15 Claims, 6 Drawing Sheets

(56) References Cited

U.S. PATENT DOCUMENTS

| | | | |
|---|---|---|---|
| 2019/0097418 A1* | 3/2019 | Chowdhury | H02H 7/26 |
| 2019/0128944 A1* | 5/2019 | Englert | H02H 3/17 |
| 2021/0075210 A1* | 3/2021 | Wahlroos | H02H 3/165 |

* cited by examiner

MULTI GROUND LINE DISCONNECTION INSPECTION DEVICE AND METHOD AND ELECTRONIC CONTROL DEVICE INCLUDING THE SAME

CROSS-REFERENCE TO RELATED APPLICATION

This application claims priority to and the benefit of Korean Patent Application No. 10-2020-0017734, filed on Feb. 13, 2020, the disclosure of which is incorporated herein by reference in its entirety.

BACKGROUND

1. Field of the Invention

The present invention relates to a multi ground line disconnection inspection device and method, and an electronic control device including the same.

2. Discussion of Related Art

Electronic control devices are connected to one ground line through a connector to be provided with ground. Recently, various electronic components are being electrified, and motor usage is increasing due to autonomous driving of vehicles and the like. Accordingly, power capacity of electronic control devices that control the same is also increased, and it is not possible to stably operate electronic components by simply providing ground with one ground line, and there is a problem in that electronic components are burned when a current exceeding the allowable current flows through a ground line.

In order to solve such a problem, a technique for providing multi grounds to an electronic control device through two ground lines has been developed.

Figure 1:
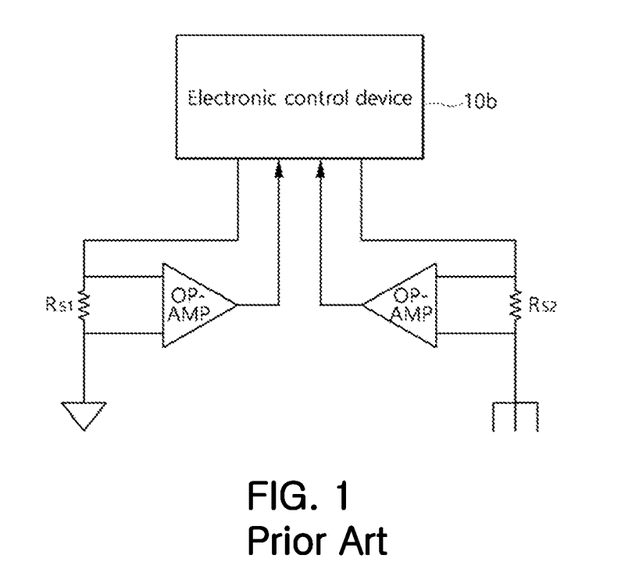
FIG. 1 is a diagram illustrating a conventional electronic control device provided with multi grounds.

FIG. 1 is a diagram illustrating a conventional electronic control device provided with multi grounds.

Referring to FIG. 1, a conventional electronic control device 10b is connected to two ground lines through connectors. That is, the electronic control device 10b is connected to two external ground lines through pins of two connectors to receive multi grounds.

In such a conventional electronic control device 10, when any one of the two ground lines is disconnected, ground is provided through the remaining ground line to prevent the entire power supply from being shut down.

The conventional electronic control device 10 inspects whether the ground line is disconnected using OP-AMP and shunt resistors $R_{s1}$ and $R_{s2}$. Specifically, the conventional electronic control device 10 connects shunt resistors $R_{s1}$ and $R_{s2}$ to each ground line, and the OP-AMP measures a current flowing through both ends of the shunt resistors $R_{s1}$ and $R_{s2}$ and detects that the ground line is disconnected when the current does not flow.

As described above, in order for the conventional electronic control device 10 to inspect the disconnection of two ground lines, two OP-AMPs and two shunt resistors $R_{s1}$ and $R_{s2}$ are required. However, since OP-AMP is relatively expensive, there is a problem in that the manufacturing cost is increased.

In addition, since the shunt resistors $R_{s1}$ and $R_{s2}$ have very small resistance values and are implemented as PCB trace resistors, there is a problem in that the accuracy thereof is low in detecting whether the ground line is disconnected.

SUMMARY OF THE INVENTION

The present invention is directed to providing a multi ground line disconnection inspection device capable of increasing an allowable current flowing to a ground line by applying two ground lines, and an electronic control device including the same.

In addition, the present invention is directed to providing a multi ground line disconnection inspection device and an electronic control device including the same, which can reduce a manufacturing cost in inspecting whether a ground line is disconnected.

In addition, according to the present invention, the electronic control device is provided with multi grounds from two ground lines, and even if any one of these ground lines is disconnected, grounding can be provided through the remaining ground lines, thereby securing redundancy.

The technical problems to be achieved in the present invention are not limited to the technical problems mentioned above, and other technical problems that are not mentioned can be clearly understood by those of ordinary skill in the technical field to which the present invention pertains from the following description.

In order to achieve the above-mentioned objects, the present invention provides a multi ground line disconnection inspection device as a device for inspecting whether a plurality of ground lines that are connected to a ground node of an electronic control device are disconnected, including a plurality of test lines having one end connected to a plurality of ground lines, respectively, a plurality of connection switches connected to the ground node and the other end of a plurality of test lines, respectively, a plurality of test power supplies for applying test voltages to a plurality of test nodes respectively positioned on a plurality of test lines, respectively, and a determination unit for determining whether a plurality of ground lines are disconnected by detecting voltages of the plurality of test nodes.

In addition, the multi ground line disconnection inspection device of the present invention further includes a plurality of test switches for turning on or turning off a plurality of connection switches, respectively, and a control unit for turning on and turning off a plurality of test switches.

Herein, the connection switch is turned off and turned on according to turn-on and turn-off of the test switch.

In addition, the determination unit determines that the ground line is disconnected when the voltage of the test node changes according to turn-on and turn-off of the connection switch.

In addition, the determination unit determines that the ground line is disconnected when the voltage of the test node changes while the test switch is off.

In addition, when inspecting whether a plurality of ground lines are disconnected, the ground node is connected to at least one of the plurality of ground lines.

In addition, a plurality of test lines are respectively connected to a plurality of ground lines through pins provided in connectors.

In addition, the present invention provides an electronic control device, including a ground node connected to a plurality of ground lines, an electronic circuit component connected to a plurality of ground nodes, a plurality of test lines having one end connected to a plurality of ground lines, respectively, a plurality of connection switches connected to the ground node and the other end of the plurality of test lines, respectively, a plurality of test power supplies for applying test voltages to test nodes respectively positioned on the plurality of test lines, respectively, and a determination unit for determining whether a plurality of ground lines are disconnected by detecting voltages of a plurality of test nodes.

In addition, the electronic control device of the present invention further includes a plurality of test switches for turning on or turning off a plurality of connection switches, and a control unit for sequentially turning on and turning off a plurality of test switches.

In addition, when inspecting whether a plurality of ground lines are disconnected, the ground node is connected to at least one of the plurality of ground lines In addition, the present invention provides a multi ground line disconnection inspection method as a method for inspecting whether a plurality of ground lines that are connected to a ground node of an electronic control device are disconnected, including applying a test power to a test node positioned on a test line connected to the ground line, turning off and turning on a connection switch disposed between the test line and the ground node, and determining whether the ground line is disconnected by detecting a voltage of the test node.

In addition, a step of turning off and turning on the connection switch and a step of determining whether the ground line is disconnected are steps that are sequentially repeated for a plurality of ground lines.

In addition, a step of determining whether the ground line is disconnected is a step of determining that the ground line is disconnected when the voltage of the test node changes according to turn-on and turn-off of the connection switch.

In addition, a step of determining whether the ground line is disconnected is a step of determining that the ground line is disconnected when the voltage of the test node changes while the connection switch is off.

In addition, the multi ground line disconnection inspection method of the present invention further includes degrade-controlling the electronic control device when part of the plurality of ground lines is disconnected.

According to the present invention, by applying two ground lines, the allowable current flowing through a ground line is increased, electronic components can be stably operated, and the electronic components can be protected from overcurrent.

In addition, according to the present invention, it is possible to improve system safety by inspecting whether the ground line is disconnected. Further, since a relatively inexpensive semiconductor switching device is used instead of relatively expensive OP-AMP to inspect whether the ground line is disconnected, the manufacturing cost can be reduced.

In addition, according to the present invention, when it is determined that any one of the two ground lines is disconnected, power supplied to the electronic control device can be reduced, thereby ensuring continuous operation of the electronic circuit component.

In addition, according to the present invention, the electronic control device is provided with multi grounds from two ground lines, and even if any one of these ground lines is disconnected, ground can be provided through the remaining ground lines, thereby securing redundancy.

The effects that can be obtained in the present invention are not limited to the above-mentioned effects, and other effects not mentioned can be clearly understood by those of ordinary skill in the technical field to which the present invention pertains from the following description.

DETAILED DESCRIPTION OF EXEMPLARY EMBODIMENTS

Hereinafter, with reference to the accompanying drawings, exemplary embodiments of the present invention will be described in detail such that those of ordinary skill in the art can easily practice the present invention. The present invention may be implemented in various different forms and is not limited to the exemplary embodiments described herein. In the drawings, parts irrelevant to the description are omitted in order to clearly describe the present invention, and the same reference numerals are assigned to the same or similar constitutional components throughout the specification.

In the present specification, terms such as "include" or "have" are intended to designate the presence of features, numbers, steps, operations, components, parts, or combinations thereof described in the specification, but it is to be understood that it does not preclude the possibility of the presence or addition of one or more other features or numbers, steps, operations, components, parts, or combinations thereof.

Figure 2:
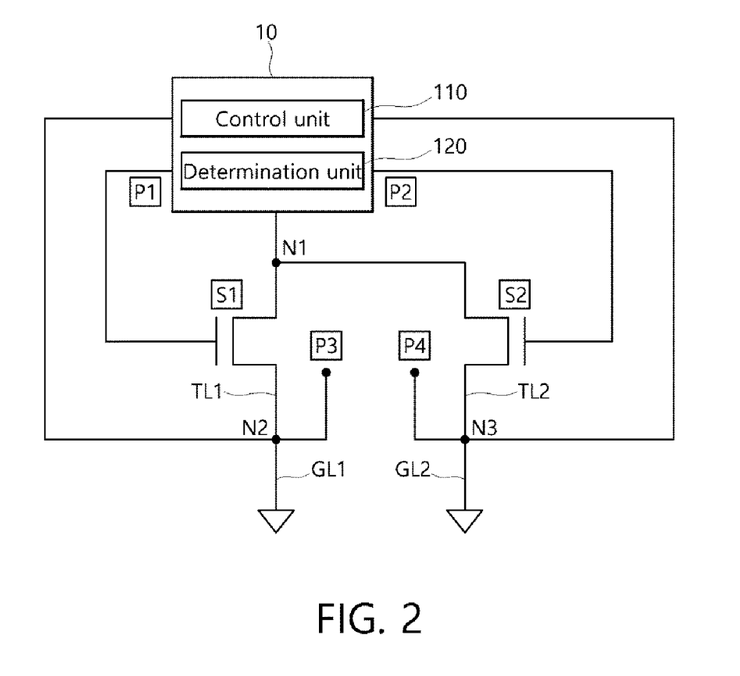
FIG. 2 is a schematic circuit diagram of a multi ground line disconnection inspection device according to an exemplary embodiment of the present invention.
Figure 3:
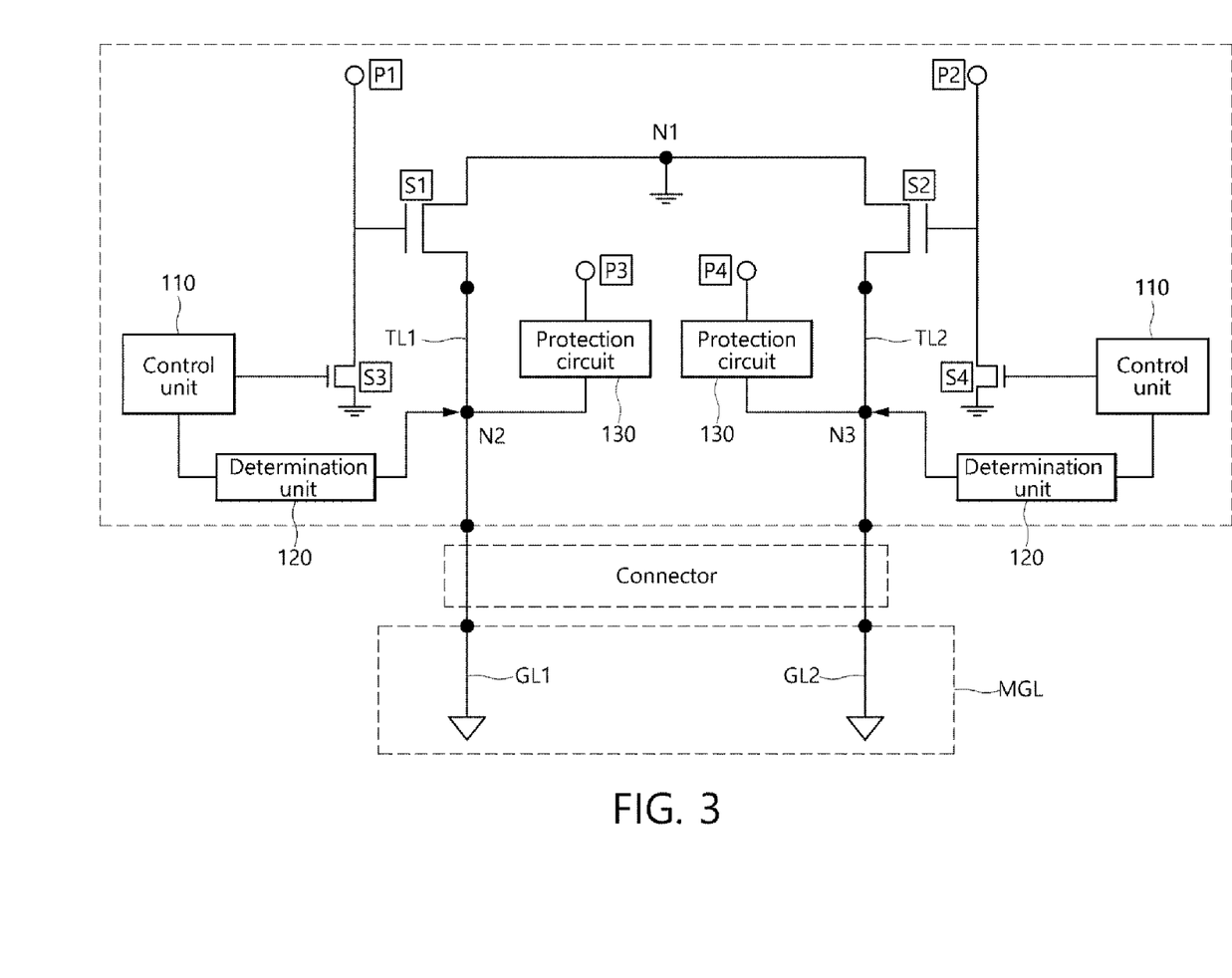
FIG. 3 is a detailed circuit diagram of a multi ground line disconnection inspection device according to an exemplary embodiment of the present invention.

FIG. 2 is a schematic circuit diagram of a multi ground line disconnection inspection device according to an exemplary embodiment of the present invention, and FIG. 3 is a detailed circuit diagram of a multi ground line disconnection inspection device according to an exemplary embodiment of the present invention.

As illustrated in FIG. 2, the multi ground line disconnection inspection device according to an exemplary embodiment of the present invention is a device for inspecting whether a plurality of ground lines that are connected to a ground node N1 of an electronic control device 10 are disconnected, and it may be manufactured as a separate module or mounted inside the electronic control device 10.

Hereinafter, the multi ground line disconnection inspection device according to an exemplary embodiment of the present invention will be described as an example of inspecting whether the first and second ground lines GL1 and G2 are disconnected, but is not limited thereto, and it is possible to inspect whether two or more ground lines are disconnected.

The electronic control device 10 may be applied to a brake control device, and in this case, multiple grounds may be provided to valves, inverters, motors, and the like constituting a brake device. For example, the electronic control device may be applied to an integrated dynamic brake (IDB), an anti-lock brake system (ABS), an electronic stability control (ESC), electronic stability program (ESP), or the like, but is not limited thereto.

As illustrated in FIG. 2, the electronic control device 10 may include a control unit 110 and a determination unit 120, and as illustrated in FIG. 3, a ground node N1 connected to external first and second ground lines GL1, GL2 and multiple electronic circuit components connected to the ground node N1 may be further included. Such electronic control devices include various control devices installed in a vehicle such as a steering control device, a brake control device, and the like.

The multi ground line disconnection inspection device according to an exemplary embodiment of the present invention may be constituted by including first and second test lines TL1 and TL2, first and second connection switches S1 and S2, first and second connection power supplies P1 and P2, and first and second test power supplies P3 and P4.

Specifically, the first test line TL1 is connected to the first ground line GL1, and the second test line TL2 is connected to the second ground line GL2. Also, the first and second test lines TL1 and TL2 are connected to the ground node N1 of the electronic control device. In addition, the first connection switch S1 is disposed between the first test line TL1 and the ground node N1, and the second connection switch S2 is disposed between the second test line TL2 and the ground node N1.

Herein, the first connection switch S1 is turned on by receiving the first connection power P1 from the electronic control device, and the second connection switch S2 is turned on by receiving the second connection power P2 from the electronic control device.

In addition, the first test voltage P3 is applied to the first test node N2 positioned on the first test line TL1, and the second test voltage P4 is applied to the second test node N3 positioned on the second test line TL2.

The electronic control device 10 detects voltages of the first and second test nodes N2 and N3 while controlling the first and second connection switches S1 and S2 to inspect whether the first and second ground lines GL1 and GL2 are disconnected.

The multi ground line disconnection inspection device according to an exemplary embodiment of the present invention may be constituted by further including first and second test switches S3 and S4.

Specifically, one end of the first test line TL1 is connected to the first ground line GL1, and the first connection switch S1 is connected to the ground node N1 and the other end of the first test line TL. Further, the second test line TL2 has one end connected to the second ground line GL2, and the second connection switch S2 is connected to the ground node N1 and the other end of the second test line TL2.

The first test node N2 is positioned between one end and the other end of the first test line TL, and the second test node N3 is positioned between one end and the other end of the second test line TL2.

The first test switch S3 turns on or turns off the first connection switch S1, and the second test switch S4 turns on or turns off the second connection switch S2. Herein, the first and second connection switches S1 and S2 and the first and second test switches S3 and S4 may be formed of semiconductor switching elements.

Specifically, in the first connection switch S1, a source electrode is connected to the ground node N1, a drain electrode is connected to the first test node N2, and a gate electrode is connected to the first connection power supply P1. In addition, in the second connection switch S2, a source electrode is connected to the ground node N1, a drain electrode is connected to the second test node N3, and a gate electrode is connected to the second connection power supply P2.

In addition, in the first test switch S3, a source electrode is connected to the gate electrode of the first connection switch S1, a drain electrode is connected to the ground, and a gate electrode is connected to the control unit 110. Further, in the second test switch S4, a source electrode is connected to the gate electrode of the second connection switch S2, a drain electrode is connected to the ground, and a gate electrode is connected to the control unit 110.

The control unit 110 applies on-off control signals to the gate electrodes of the first and second test switches S3 and S4, respectively, to turn on or turn off the first and second test switches S3 and S4, respectively. In FIG. 2, the control unit 110 and the determination unit 120 are illustrated to be two components, respectively, but this is for convenience and may be formed of one component.

The first connection power supply P1 applies a connection voltage to the gate electrode of the first connection switch S1, and the second connection power supply P2 applies a connection voltage to the gate electrode of the second connection switch S2. Herein, the connection voltage is a voltage for turning on the first and second connection switches S1 and S2.

In addition, the first test power supply P3 applies a test voltage to the first test node N2, and the second test power supply P4 applies a test voltage to the second test node N2.

The determination unit 120 determines whether the first and second ground lines GL1 and GL2 are disconnected by detecting voltages of the first and second test nodes N2 and N3, respectively.

As described above, the multi ground line disconnection inspection device according to an exemplary embodiment of the present invention may improve system safety by inspecting whether the first and second ground lines GL1 and GL2 are disconnected. In addition, since a relatively inexpensive semiconductor switching element is used instead of relatively expensive OP-AMP to inspect whether the first and second ground lines GL1 and GL2 are disconnected, the manufacturing cost may be reduced.

The multi ground line disconnection inspection device according to an exemplary embodiment of the present invention may further include a protection circuit 130. Herein, the protection circuit 130 is provided between the first test power supply P3 and the first test node N2, and between the first test power supply P3 and the second test node N2, respectively, to restrict current flowing to the first and second test nodes N2 and N3.

The first and second test lines TL1 and TL2 may be connected to external first and second ground lines GL1 and GL2 through pins provided in connectors, respectively.

As such, since the electronic control device 10 is provided with multi grounds through two pins provided in connectors, the existing connector may be used as there is no need to design a new connector with increased pin capacity when applying a large power supply, and thus, the development cost of a connector may be reduced.

Figure 4:
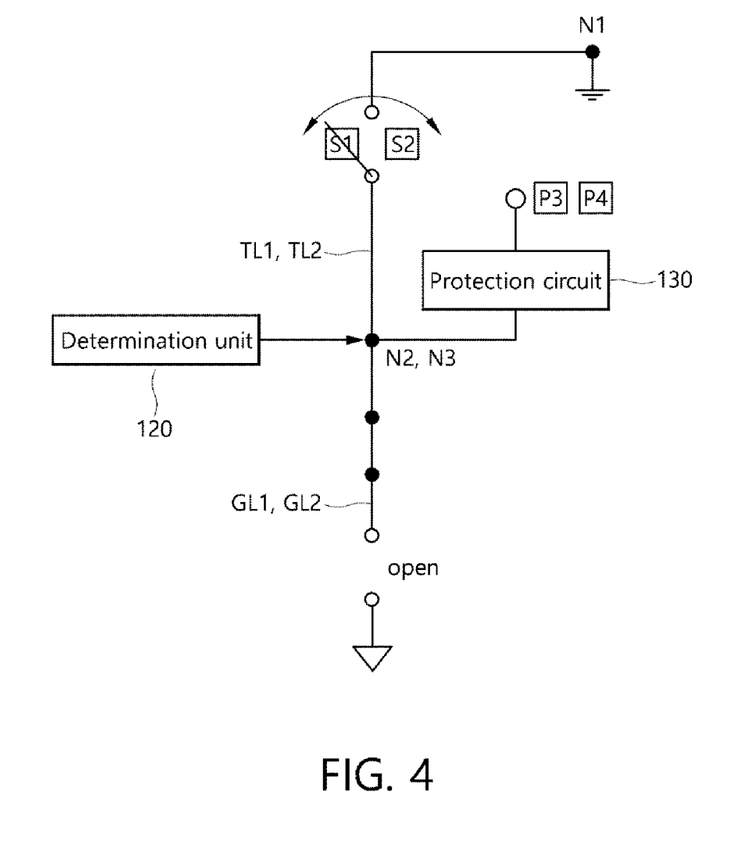
FIG. 4 is a disconnection inspection operation circuit diagram of the ground line of a multi ground line disconnection inspection device according to an exemplary embodiment of the present invention.
Figure 5:
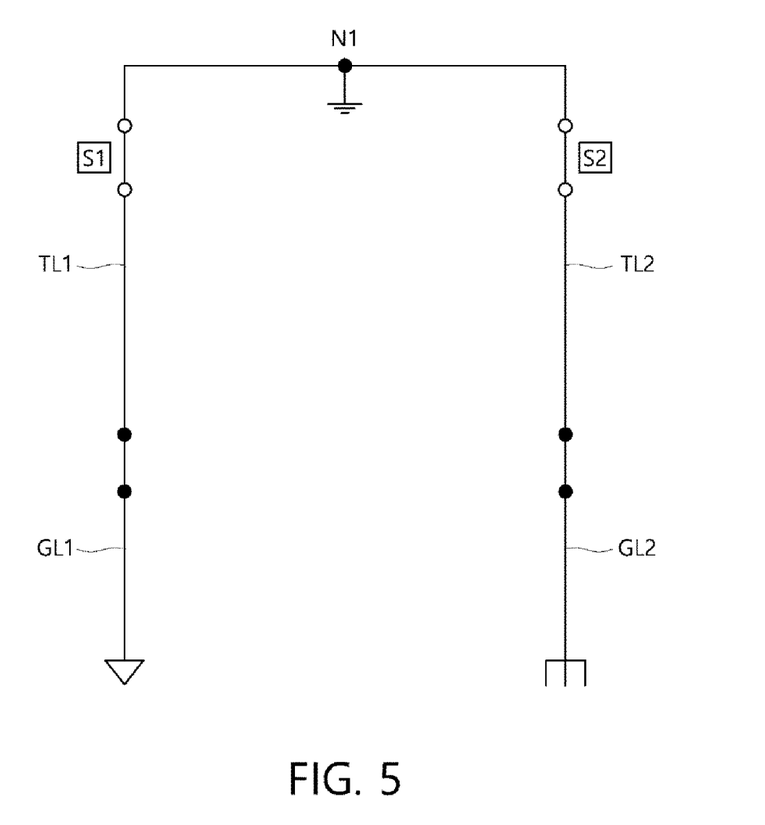
FIG. 5 is an operation circuit diagram after finishing a disconnection inspection of a multi ground line disconnection inspection device according to an exemplary embodiment.
Figure 6:
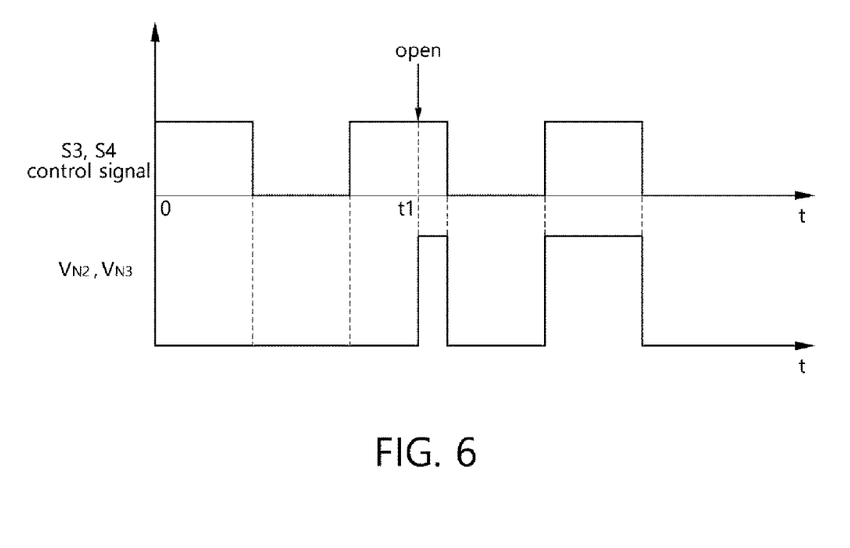
FIG. 6 is a graph illustrating a control signal of a test switch and a voltage waveform of a test node in the multi ground line disconnection inspection device according to an exemplary embodiment of the present invention.

FIG. 4 is a disconnection inspection operation circuit diagram of the multi ground line of a multi ground line disconnection inspection device according to an exemplary embodiment of the present invention, and FIG. 5 is an operation circuit diagram after finishing a disconnection inspection of a multi ground line disconnection inspection device according to an exemplary embodiment. In addition, FIG. 6 is a graph illustrating a control signal of a test switch and a voltage waveform of a test node in the multi ground line disconnection inspection device according to an exemplary embodiment of the present invention.

Hereinafter, the disconnection inspection method of a multi ground line disconnection inspection device according to an exemplary embodiment of the present invention will be described with reference to the drawings.

Meanwhile, when the disconnection inspection is simultaneously performed for a plurality of ground lines, the multi ground line disconnection inspection device or electronic control device is not provided with ground from a plurality of ground lines, and the multi ground line disconnection inspection device or electronic control device is shut down.

As such, the multi ground line disconnection inspection device according to an exemplary embodiment of the present invention alternately inspects whether a plurality of ground lines are disconnected. That is, when inspecting whether a plurality of ground lines are disconnected, the ground node N1 is connected to at least one of a plurality of ground lines, and may be provided with ground from the connected ground line, and through this, the multi ground line disconnection inspection device or electronic control device may perform a series of operations including disconnection inspection.

In order to inspect whether the first ground line GL1 is disconnected, the control unit 110 maintains the second test switch S4 in an off state, and turns on and turns off the first test switch S3 alternately. Such a process may be repeated a certain number of times or for a certain time.

Specifically, when the second test switch S4 is maintained in an off state, the second connection switch S2 is maintained in an on state by applying a connection voltage to the gate electrode. Accordingly, the ground node N1 is maintained to be connected to the second ground line GL2, and may be provided with ground from the second ground line GL2, and through this, the multi ground line disconnection inspection device or electronic control device may perform a series of operations including a disconnection inspection.

When the first test switch S3 is turned on, the connection voltage is not applied to the gate electrode of the first connection switch S1 such that the first connection switch S1 is turned off. Accordingly, the ground node N1 is disconnected from the first ground line GL1. In this case, the determination unit 120 detects the voltage of the first test node N2.

Herein, the voltage of the first test node N2 becomes 0 V, which is equal to the first ground line GL1 when the first ground line GL1 is not disconnected (open), but as shown in FIG. 3, when the first ground line GL1 is disconnected (open), a predetermined voltage is detected by the first test power supply P3.

In addition, when the first test switch S3 is turned off while the ground node N1 is connected to the second ground line GL2, a connection voltage is applied to the gate electrode of the first connection switch S1 to turn on the first connection switch S1. Accordingly, the ground node N1 is connected to the first test line TL1. In this case, the determination unit 120 detects the voltage of the first test node N2.

Herein, the voltage of the first test node N2 becomes 0 V by the first ground line GL1 when the first ground line GL1 is not disconnected (open), but as shown in FIG. 4, it becomes 0 V by the second ground line GL2 when the first ground line GL1 is disconnected (open). That is, the voltage of the first test node N2 becomes 0 V which is equal to the first ground line GL1 or the second ground line GL2 regardless of whether the first ground line GL1 is disconnected (open).

In summary, as illustrated in FIG. 6, the voltage $V_{N2}$ of the first test node N2 becomes constant regardless of the turn-on and turn-off control signals of the first test switch S3 when the first ground line is not disconnected (0 to t1), and when the first ground line GL1 is disconnected (after t1), it changes according to the turn-on and turn-off control signals of the first test switch S3, or changes in the on state of the first test switch S3.

In this way, in a state where the ground node N1 is connected to the second ground line GL2, the determination unit 120 determines that the first ground line GL1 is disconnected when the voltage of the first test node N2 changes according to the turn-on and turn-off of the first test switch S3, or when the voltage of the first test node N2 changes in an on-state of the first test switch S3.

In order to inspect whether the second ground line GL2 is disconnected, the control unit 110 maintains the first test switch S3 in an off state, and turns on and turns off the second test switch S4 alternately. Such a process may be repeated a certain number of times or for a certain time.

Specifically, when the first test switch S3 is maintained in an off state, the first connection switch S1 is maintained in an on state by applying a connection voltage to the gate electrode. Accordingly, the ground node N1 is maintained to be connected to the first ground line GL1, and may be provided with ground from the first ground line GL1, and through this, the multi ground line disconnection inspection device or electronic control device may perform a series of operations including a disconnection inspection.

Meanwhile, when the determination unit 120 determines that the first ground line GL1 is disconnected, since disconnection is determined by receiving ground from the second ground line GL2, it may be estimated that the second ground line GL2 is normal.

When the second test switch S4 is turned on, the connection voltage is not applied to the gate electrode of the second connection switch S2 such that the second connection switch S2 is turned off. Accordingly, the ground node N1 is disconnected from the second ground line GL2. In this case, the determination unit 120 detects the voltage of the second test node N3.

Herein, the voltage of the second test node N3 becomes 0 V, which is equal to the second ground line GL2 when the second ground line GL2 is not disconnected (open), but as shown in FIG. 5, when the second ground line GL2 is disconnected (open), a constant voltage is detected by the second test power supply P3.

In addition, when the second test switch S4 is turned off while the ground node N1 is connected to the first ground line GL1, a connection voltage is applied to the gate electrode of the second connection switch S2 such that the second connection switch S2 is turned on. Accordingly, the ground node N1 is connected to the second test line TL2. In this case, the determination unit 120 detects the voltage of the second test node N3.

Herein, the voltage of the second test node N3 becomes 0 V by the second ground line GL2 when the second ground line GL2 is not disconnected (open), but as shown in FIG. 6, when the second ground line GL2 is disconnected (open), it becomes 0 V by the first ground line GL1. That is, the voltage of the second test node N3 becomes 0 V which is equal to the first ground line GL1 or the second ground line GL2 regardless of whether the second ground line GL2 is disconnected (open).

In summary, as illustrated in FIG. 6, the voltage $V_{N3}$ of the second test node N3 becomes constant regardless of the turn-on and turn-off control signals of the second test switch S4 when the second ground line is not disconnected (0 to t1), and when the second ground line GL2 is disconnected (after t1), it changes according to the turn-on and turn-off control signals of the second test switch S4, or changes in the on state of the second test switch S4.

In this way, in a state where the ground node N1 is connected to the first ground line GL1, the determination unit 120 determines that the second ground line GL2 is disconnected when the voltage of the second test node N3 changes according to the turn-on and turn-off of the second test switch S4, or when the voltage of the second test node N3 changes in an on-state of the second test switch S4.

In this case, the determination unit 120 may identify the location and number of disconnected ground lines when it determines whether a plurality of ground lines are disconnected.

When it is determined by the determination unit 120 that any one of the first and second ground lines GL1 and GL2 is disconnected, the control unit 110 may perform a degraded operation and indicate disconnection information to the outside. That is, it is possible to reduce the power supplied to the electronic control device, thereby ensuring continuous operation of the electronic circuit component. In addition, while the electronic control device receives multi grounds from the first and second ground lines GL1 and GL2, it may receive ground through the remaining ground line even if any one of the first and second ground lines GL1 and GL2 is disconnected, thereby securing redundancy.

As illustrated in FIG. 5, when the disconnection inspection of the first and second ground lines GL1 and GL2 is finished, the control unit 110 turns off both the first and second test switches S3 and S4. Accordingly, both the first and second connection switches S1 and S2 are turned on, and the first and second ground lines GL1 and GL2 are connected to the ground node N1 to provide multi grounds to the electronic control device.

According to the present invention, by applying two ground lines, the allowable current flowing through the ground line is increased such that the electronic component may be stably operated, and the electronic component may be protected from overcurrent.

In this way, the multi ground line disconnection inspection device according to an exemplary embodiment of the present invention may improve system safety by inspecting whether the ground line is disconnected. In addition, since a relatively inexpensive semiconductor switching device is used instead of relatively expensive OP-AMP to inspect whether the ground line is disconnected, the manufacturing cost may be reduced. In addition, if it is determined that any one of the two ground lines is disconnected, power supplied to the electronic control device may be reduced, thereby ensuring continuous operation of the electronic circuit component.

Figure 7:
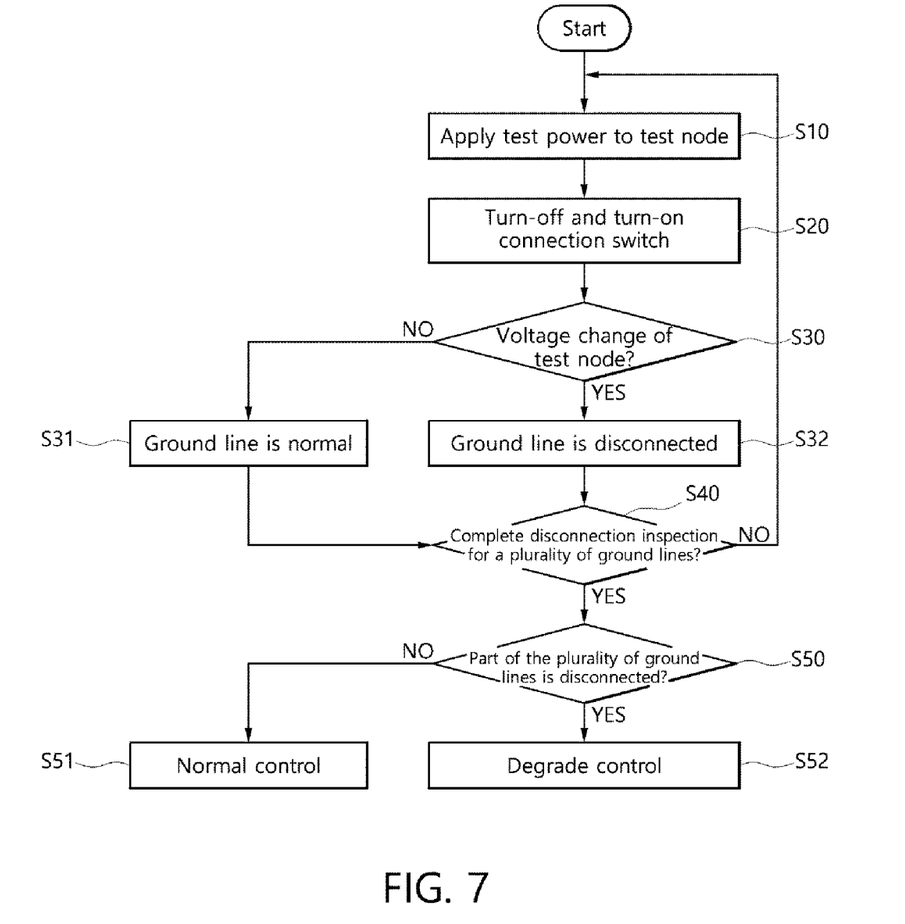
FIG. 7 is a flowchart of a disconnection inspection method of a ground line, in a multi ground line disconnection inspection method according to an exemplary embodiment of the present invention.

FIG. 7 is a flowchart of a disconnection inspection method of multi ground lines, in a multi ground line disconnection inspection method according to an exemplary embodiment of the present invention.

Hereinafter, the multi ground line disconnection inspection method according to an exemplary embodiment of the present invention will be described with reference to FIGS. 1 to 7, but the same contents as those described above will be omitted.

Referring to FIG. 7, a test power is applied to a test node positioned on a test line connected to a ground line (S10).

Next, the connection switch disposed between the test line and the ground node is turned off and turned on (S20).

Next, it is determined whether the ground line is disconnected by detecting the voltage of the test node (S30).

In this case, when the voltage of the test node does not change according to turn-on or turn-off of the connection switch, it is determined that the ground line is normal (S31). In contrast, when the voltage of the test node changes according to turn-on or turn-off of the connection switch, it is determined that the ground line is disconnected (S32). In addition, when the voltage of the test node changes while the connection switch is turned on, it is determined that the ground line is disconnected (S32).

Next, it is determined whether the disconnection inspection is completed for a plurality of ground lines (S40). In this case, if the disconnection inspection is not completed, applying test power to the test node (S10), turning off and turning on the connection switch (S20), and determining whether the ground line is disconnected (S30) are sequentially repeated for a plurality of ground lines until the disconnection inspection is completed.

Next, when the disconnection inspection is completed, it is determined whether part of the plurality of ground lines is disconnected (S50). In this case, if all of the plurality of ground lines are normal, the electronic control device 10 is normally controlled (S51), and if part of the plurality of ground lines is disconnected, the electronic control device 10 is degrade-controlled (S52).

As described above, in the multi ground line disconnection inspection method according to an exemplary embodiment of the present invention, system safety may be improved by inspecting whether the ground line is disconnected. In addition, since a relatively inexpensive semiconductor switching element is used instead of relatively expensive OP-AMP to inspect whether the ground line is disconnected, the manufacturing cost may be reduced. In addition, if it is determined that any one of the two ground lines is disconnected, power supplied to the electronic control device may be reduced, thereby ensuring continuous operation of the electronic circuit component.

Although an exemplary embodiment of the present invention has been described above, the spirit of the present invention is not limited to the exemplary embodiment presented in the present specification, and those skilled in the art who understand the spirit of the present invention will be able to easily propose other exemplary embodiments by supplementation, modification, deletion, addition, and the like of components within the scope of the same spirit, but this will also fall within the scope of the present invention.

What is claimed is:

1. A multi ground line disconnection inspection device as a device for inspecting whether a plurality of ground lines that are connected to a ground node of an electronic control device are disconnected, comprising:
   a plurality of test lines having one end connected to the plurality of ground lines, respectively;
   a plurality of connection switches connected to the ground node and the other end of the plurality of test lines, respectively;
   a plurality of test power supplies for applying test voltages to a plurality of test nodes respectively positioned on the plurality of test lines, respectively; and a determination unit for determining whether the plurality of ground lines are disconnected by detecting voltages of the plurality of test nodes.

2. The multi ground line disconnection inspection device of claim 1, further comprising:
a plurality of test switches for turning on or turning off the plurality of connection switches, respectively; and
a control unit for turning on and turning off the plurality of test switches.

3. The multi ground line disconnection inspection device of claim 2, wherein each of the plurality of connection switches is turned off and turned on according to turn-on and turn-off of each corresponding test switch of the plurality of test switches, respectively.

4. The multi ground line disconnection inspection device of claim 1, wherein the determination unit determines that a ground line among the plurality of ground lines is disconnected when the voltage of a corresponding test node among the plurality of test nodes changes according to turn-on and turn-off of a corresponding connection switch among the plurality of connection switches, respectively.

5. The multi ground line disconnection inspection device of claim 1, wherein the determination unit determines that a ground line among the plurality of ground lines is disconnected when the voltage of a corresponding test node among the plurality of test nodes changes while a corresponding connection switch among the plurality of connection switches is off, respectively.

6. The multi ground line disconnection inspection device of claim 1, wherein when inspecting whether a plurality of ground lines are disconnected, the ground node is connected to at least one of the plurality of ground lines.

7. The multi ground line disconnection inspection device of claim 1, wherein the plurality of test lines are connected to the plurality of ground lines through pins provided in connectors, respectively.

8. An electronic control device, comprising:
a ground node connected to a plurality of ground lines; an electronic circuit component connected to the plurality of ground lines;
a plurality of test lines having one end connected to the plurality of ground lines, respectively;
a plurality of connection switches connected to the ground node and the other end of the plurality of test lines, respectively;
a plurality of test power supplies for applying test voltages to test nodes respectively positioned on the plurality of test lines, respectively; and
a determination unit for determining whether the plurality of ground lines are disconnected by detecting voltages of the plurality of test nodes.

9. The electronic control device of claim 8, further comprising:
a plurality of test switches for turning on or turning off the plurality of connection switches, respectively; and
a control unit for sequentially turning on and turning off the plurality of test switches.

10. The electronic control device of claim 8, wherein when inspecting whether the plurality of ground lines are disconnected, the ground node is connected to at least one of the plurality of ground lines.

11. A multi ground line disconnection inspection method as a method for inspecting whether a plurality of ground lines that are connected to a ground node of an electronic control device are disconnected, comprising:
applying a test power to a test node positioned on a test line connected to a ground line among the plurality of ground lines;
turning off and turning on a connection switch disposed between the test line and the ground node; and
determining whether the ground line is disconnected by detecting a voltage of the test node.

12. The multi ground line disconnection inspection method of claim 11, wherein the turning off and turning on the connection switch and the determining whether the ground line is disconnected are sequentially repeated for each ground line of the plurality of ground lines.

13. The multi ground line disconnection inspection method of claim 11, wherein the ground line is determined as disconnected when the voltage of the test node changes according to turn-on and turn-off of the connection switch.

14. The multi ground line disconnection inspection method of claim 11, wherein the ground line is determined as disconnected when the voltage of the test node changes while the connection switch is off.

15. The multi ground line disconnection inspection method of claim 11, further comprising degrade-controlling the electronic control device when part of the plurality of ground lines is disconnected.

\* \* \* \* \*